United States Patent
Steinberg et al.

(10) Patent No.: US 9,131,629 B2
(45) Date of Patent: Sep. 8, 2015

(54) COOLING APPARATUS FOR A MOTOR VEHICLE HAVING A DRIVE WHICH COMPRISES TWO MOTORS

(75) Inventors: Helmut Steinberg, Störnstein (DE); Hans Hohenner, Müchen (DE); Josef Krauthan, Tirschenreuth (DE); Udo Mayer, Weiden (DE); Helmut Hanebuth, Puschersreuth (DE)

(73) Assignee: NEXANS, Paris (FR)

( * ) Notice: Subject to any disclaimer, the term of this patent is extended or adjusted under 35 U.S.C. 154(b) by 0 days.

(21) Appl. No.: 11/546,524

(22) Filed: Oct. 11, 2006

(65) Prior Publication Data

US 2007/0107962 A1 May 17, 2007

(30) Foreign Application Priority Data

Oct. 12, 2005 (EP) .................... 05292136

(51) Int. Cl.
*B60K 11/00* (2006.01)
*H05K 7/20* (2006.01)

(52) U.S. Cl.
CPC .................. *H05K 7/20927* (2013.01)

(58) Field of Classification Search
USPC ........... 180/68.1, 68.2, 68.4, 65.1, 65.3, 65.8, 180/309; 361/676, 695, 699; 310/52, 54; 318/471, 472
See application file for complete search history.

(56) References Cited

U.S. PATENT DOCUMENTS

| | | | | |
|---|---|---|---|---|
| 3,763,950 A * | 10/1973 | Rockwell | .................. | 180/309 |
| 5,255,733 A * | 10/1993 | King | .................. | 180/65.3 |
| 5,834,132 A * | 11/1998 | Hasegawa et al. | .................. | 429/62 |
| 6,323,613 B1 * | 11/2001 | Hara et al. | .................. | 318/471 |
| 6,357,541 B1 * | 3/2002 | Matsuda et al. | .................. | 180/68.2 |
| 6,443,253 B1 * | 9/2002 | Whitehead et al. | .................. | 180/68.1 |
| 6,568,494 B2 * | 5/2003 | Takahashi | .................. | 180/68.4 |
| 6,822,353 B2 * | 11/2004 | Koga et al. | .................. | 310/64 |
| 6,909,607 B2 * | 6/2005 | Radosevich et al. | .................. | 361/699 |
| 6,965,514 B2 * | 11/2005 | Beihoff et al. | .................. | 361/699 |
| 7,030,520 B2 * | 4/2006 | Takenaka et al. | .................. | 310/64 |
| 7,032,695 B2 * | 4/2006 | Beihoff et al. | .................. | 180/65.1 |
| 7,079,379 B2 * | 7/2006 | Yamaguchi et al. | .................. | 180/68.5 |
| 7,095,612 B2 * | 8/2006 | Beihoff et al. | .................. | 361/699 |
| 7,100,369 B2 * | 9/2006 | Yamaguchi et al. | .................. | 60/324 |
| 7,102,260 B2 * | 9/2006 | Takenaka et al. | .................. | 310/64 |
| 7,177,153 B2 * | 2/2007 | Radosevich et al. | .................. | 361/699 |
| 7,187,548 B2 * | 3/2007 | Meyer et al. | .................. | 361/699 |
| 7,187,568 B2 * | 3/2007 | Radosevich et al. | .................. | 361/699 |
| 7,211,912 B2 * | 5/2007 | Takenaka et al. | .................. | 310/54 |
| 2004/0226761 A1 * | 11/2004 | Takenaka et al. | .................. | 180/65.1 |
| 2005/0018386 A1 * | 1/2005 | Beihoff et al. | .................. | 361/676 |
| 2005/0111167 A1 * | 5/2005 | Yamaguchi et al. | .................. | 361/676 |
| 2005/0161267 A1 * | 7/2005 | Elson et al. | .................. | 180/65.1 |

* cited by examiner

*Primary Examiner* — Hau V Phan
(74) *Attorney, Agent, or Firm* — Sofer & Haroun, LLP

(57) ABSTRACT

A cooling apparatus for a motor vehicle having a drive which comprises two motors, of which one is an internal combustion engine and the other is an electric motor (3) which is connected to an inverter (2), which is connected to an electrical energy source (1), via electrical cables (4, 5). For the purpose of cooling the energy source (1) and the inverter (2), the latter are each equipped with at least one cooling element, which directly surrounds the energy source or inverter, for conducting a fluid coolant. The electrical cables (4, 5) are combined with at least two pipes which at one end are connected to the cooling elements of the energy source (1) and inverter (2) and at the other end are connected to a heat exchanger (7) in order to form a coolant circuit.

7 Claims, 2 Drawing Sheets

COOLING APPARATUS FOR A MOTOR VEHICLE HAVING A DRIVE WHICH COMPRISES TWO MOTORS

RELATED APPLICATIONS

The present application is related to and claims the benefit of priority of European Patent Application No. 05 292 136.8, filed on Oct. 12, 2005, the entirety of which are incorporated herein by reference.

FIELD OF THE INVENTION

The invention relates to a cooling apparatus for a motor vehicle having a drive which comprises two motors, of which one is an internal combustion engine and the other is an electric motor which is connected to an inverter, which is connected to an electrical energy source, via electrical cables, in which apparatus means for cooling the energy source and the inverter are arranged in the interior of the motor vehicle (EP 1 538 885 A2).

BACKGROUND OF THE INVENTION

A motor vehicle of this type has become known as a "hybrid car" and is also called this in the text which follows. A hybrid car is equipped with two different motors, one internal combustion engine (Otto or diesel) and one electric motor. It is possible to switch from one motor to the other as desired using known technology. No exhaust gases are produced when the hybrid car is operated using the electric motor. This is particularly advantageous for city driving. The electric motor is fed with power from an energy source of appropriate size. The electric motor can also be operated such that it generates additional power when the internal combustion engine is also operating, so that both motors then act as a drive for the hybrid car. This option may be particularly advantageous when driving uphill but also during overtaking operations.

In the known technology, the electric motor is a three-phase AC motor which is operated by an inverter, which is likewise accommodated in the hybrid car, generating an AC current. The energy source is, for example, an energy store which comprises a large number of capacitors (ultracaps) and may be accommodated in the boot space of a hybrid car, for example. The capacitance of the capacitors is sufficient for brief operation of the electric motor. The said capacitors are recharged, for example during the braking mode, by the electric motor which then acts as a generator. In order to operate the electric motor, it is connected to the inverter by means of a three-core electrical cable, which inverter, for its part, is connected to the energy store via another electrical cable.

In the known cooling apparatus according to EP 1 538 885 A2 which was mentioned in the introduction, the energy source and the inverter and also a DC converter are positioned in a concentrated arrangement beneath a seat of the hybrid car. Just like the electrical cable which connects them, the energy source and the inverter are heat sources. They must be cooled in order to prevent undesired heating of the interior and excessive additional loading on any air-conditioning system which may be present. To this end, a fan is installed beneath the same seat as the abovementioned assemblies in the case of this known cooling apparatus. Cooled air is sucked in from outside the hybrid car by the fan via air-guide ducts, conducted past the abovementioned assemblies and expelled from the hybrid car in the form of heated air. This cooling apparatus is costly and often disturbingly loud on account of the fan.

OBJECTS AND SUMMARY OF THE INVENTION

The invention is based on the object of simplifying the cooling apparatus described in the introduction.

According to the invention, this object is achieved in that the energy source and the inverter are each equipped with at least one cooling element, which directly surrounds the said energy source or inverter, for conducting a fluid coolant, and in that the electrical cables are combined with at least two pipes which at one end are connected to the cooling elements of the energy source and inverter and at the other end are connected to a heat exchanger in order to form a coolant circuit.

This cooling apparatus is of simple design and is easy to install. It can be accommodated in a space-saving manner within a hybrid car and it operates quietly and with a high degree of efficiency because the heat generated by the heat sources can be fully dissipated when the cooling apparatus is of an adequate size. One particular advantage is that the energy source and the inverter can be accommodated outside the interior of the hybrid car, for example in the boot space or in the engine compartment of the said hybrid car. There is also no need to arrange these two assemblies in a concentrated manner since they can be easily connected to one another by cables and pipes of the coolant circuit, which cables and pipes may be of virtually any desired length.

The electrical conductors of the cables and the pipes are particularly advantageously combined to form a single component which can then be installed as a single part. To this end, electrical conductors and pipes are expediently embedded in a common carrier which is composed of insulating material and can be produced using known technology, for example using an extruder. Since the electrical conductors are also cooled in this embodiment, the cross section of the said conductors can be reduced compared to uncooled conductors. In addition, only a few apertures are required in the body of the hybrid car because electrical conductors and pipes are combined to form one component.

The pipes of the cooling apparatus can advantageously be connected to a coolant circuit which is optionally present in the hybrid car with the radiator as heat exchanger. However, they may also be connected to another heat exchanger (for example an air-conditioning circuit).

A moisture-tight casing can in each case be placed around the energy source and the inverter, which are then both sealed off from the outside again in a moisture-tight manner, with the inclusion of an intermediate space. The intermediate space then serves as a cooling element through which a coolant can be conducted. Both assemblies can also each have their own heat exchanger which acts as a cooling element.

The cables, in the form of flat cables or round cables, may, for example, be equipped with two pipes which conduct a coolant, in particular water. The said cables may additionally have at least one optical waveguide which can be used to monitor the charge state of the capacitors of an energy store which is optionally used as an energy source. An optical waveguide may also serve as a sensor for monitoring the integrity of the cables themselves.

BRIEF DESCRIPTION OF THE DRAWINGS

Exemplary embodiments of the subject matter of the invention are illustrated in the drawings, in which.

DETAILED DESCRIPTION

Figure 1:
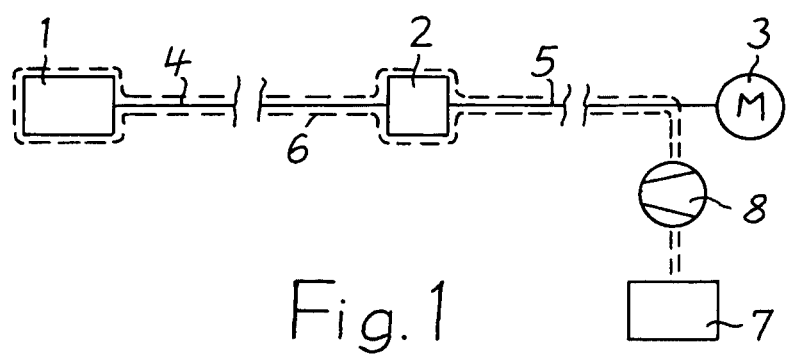
FIG. 1 shows a schematic illustration of a power-supply unit for an electric motor of a hybrid car.

FIG. 1 schematically illustrates an energy source 1 which may be an energy store which comprises a large number of capacitors or a battery which is suitable for hybrid operation, an inverter 2, and an electric motor 3 which is designed as a three-phase AC motor. The energy source 1 and inverter 2 are connected to one another by a, for example two-core, electrical cable 4. A, for example three-core, electrical cable 5 is connected between the inverter 2 and the electric motor 3. Both cables 4 and 5 should be provided with a screen (not illustrated for the sake of simplicity) in order to protect against electromagnetic radiation (EMC), independently of their design which is described further below. Other parts, for example a DC converter, which may be used to supply power to the electric motor 3 are not illustrated for the sake of clarity. If such parts generate heat during operation, they are included in a coolant circuit which is described further below.

The dashed line also drawn in FIG. 1 is intended to indicate a coolant circuit 6 which is routed around the energy source 1 and inverter 2 and along the cables 4 and 5. A heat exchanger 7 and a pump 8 by means of which a fluid coolant, in particular water, can be passed through the coolant circuit 6 are also part of the said coolant circuit 6.

Figure 2:
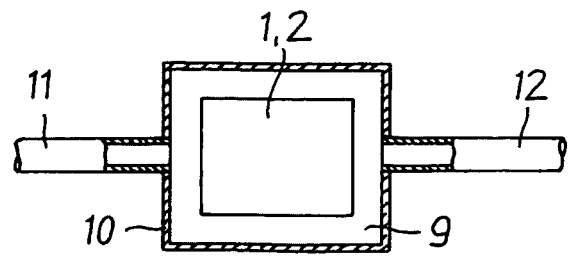
FIG. 2 shows an enlarged illustration of one embodiment of an energy source which can be used in the power-supply unit.

Any desired cooling element which can be connected to the coolant circuit 6 can be arranged around the assemblies energy store 1 and inverter 2. The said cooling element may be, for example, a pipe which is placed around these assemblies in each case in turns, or a component which is designed as a heat exchanger. However, in one preferred embodiment, the two assemblies are sealed off from the outside in a moisture-tight manner and, according to FIG. 2, a moisture-tight casing 10 is placed around the said assemblies with the inclusion of an intermediate space 9. The intermediate space 9 is then respectively part of the coolant circuit 6 to which pipes 11 and 12 can be connected, as is indicated in FIG. 2. The casing 10 may be composed of an electrically conductive material, for example copper or aluminium. However, a plastic such as polypropylene or polyethylene may also be used.

Figure 3:
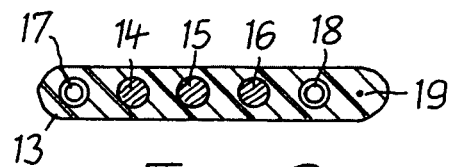
FIGS. 3 to 5 show sectional views of different embodiments of cables which can be used in the power-supply unit.

Pipes used for the coolant circuit 6 are expediently combined with the cables 4 and 5. To this end, they may be combined, for example, with ready cables 4 and 5 to form one unit by being secured to the outside of the said cables. However, in one preferred embodiment, the pipes are integrated in the cables 4 and 5 as parts of the latter. This is explained in the text which follows for the cable 5 with reference to FIGS. 3 to 5:

The cable 5 according to FIG. 3 is in the form of a flat cable. It has three electrical conductors 14, 15 and 16 which are embedded next to one another in a common carrier 13 which is composed of insulating material, two pipes 17 and 18 and an optical waveguide 19 which are likewise surrounded by the insulating material. In principle, any suitable plastic which can be extruded or processed using an injection-moulding method can be used for the carrier 13. The pipes 17 and 18 may be composed of an electrically conductive material, for example copper or aluminium. However, a plastic such as polypropylene or polyethylene can also be used. In the coolant circuit 6, one end of the said pipes is connected to the intermediate space 9 of the inverter 2 and, further on, to corresponding pipes in the cable 4 which are connected to the intermediate space 9 of the energy source 1. The other ends of the pipes 17 and 18 are connected to the pump 8 which is used to move the coolant through the coolant circuit 6. The heated coolant is supplied to the heat exchanger 7, from where the heat is discharged to the outside. The heat exchanger 7 used may advantageously be a radiator which may be present in the hybrid car.

Figure 4:
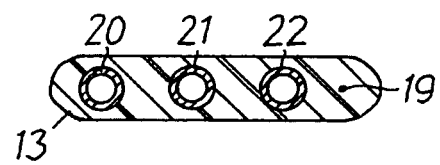

In the case of the cable 5 according to FIG. 4, the three conductors 20, 21 and 22 are of hollow design, so that they, in the form of pipes of the coolant circuit 6, can conduct the coolant themselves. Separate pipes are not required in this embodiment.

Figure 5:
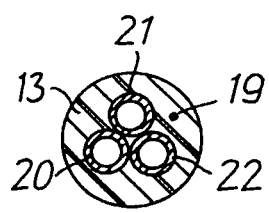

In a deviation from the illustrations in FIGS. 3 and 4, the elements of the cable 5 can also be combined in a round cable. A round cable of this type which corresponds to FIG. 4 is illustrated in FIG. 5.

The optical waveguide 19 may be connected to a measurement and evaluation unit (not illustrated). It can be used to monitor the charge state of capacitors which are present in large numbers in an energy store which forms the energy source 1, for example. The optical waveguide 19 may also be used as a sensor for monitoring the integrity of the cables 4 and 5.

The invention claimed is:

1. A cooling apparatus for a motor vehicle having a drive with two motors, one is an internal combustion engine and the other is an electric motor, said vehicle having an inverter connected to said drive, which is connected to an electrical energy source, via electrical cables, said cooling apparatus, for cooling the energy source and the inverter, comprising:

at least one cooling element equipped on said energy source and said inverter, said cooling elements directly surround said energy source and inverter, for conducting a fluid coolant; and the electrical cables are combined with at least two pipes which at one end are connected to the cooling elements of the energy source and inverter and at the other end are connected to a heat exchanger in order to form a coolant circuit.

2. Cooling apparatus according to claim 1, wherein the energy source and the inverter are sealed off from the outside in a moisture-tight manner and are each surrounded by a moisture-tight casing in order to form the respective cooling element with the inclusion of an intermediate space, and in that the pipes of the cables are connected to the intermediate spaces formed in this way.

3. Cooling apparatus according to claim 1, wherein the energy source and inverter are each equipped with additional heat exchangers which are connected to the coolant circuit.

4. Cooling apparatus according to claim 1, wherein the electrical conductors of the cables and the pipes are embedded in a common carrier which is composed of insulating material.

5. Cooling apparatus according to claim 4, wherein the conductors and pipes are arranged next to one another in one plane in order to form a flat cable.

6. Cooling apparatus according to claim 4, wherein conductors and pipes are combined in the form of a round cable.

7. Cooling apparatus according to claim 4, wherein the conductors are of hollow design and are therefore themselves designed as pipes for conducting the coolant.

* * * * *